United States Patent
Kim et al.

(10) Patent No.: US 8,853,821 B2
(45) Date of Patent: Oct. 7, 2014

(54) VERTICAL CAPACITORS AND METHODS OF FORMING THE SAME

(75) Inventors: Seong-il Kim, Daejeon (KR); Sang-Heung Lee, Daejeon (KR); Jong-Won Lim, Daejeon (KR); Hyung Sup Yoon, Daejeon (KR); Jongmin Lee, Daejeon (KR); Byoung-Gue Min, Daejeon (KR); Jae Kyoung Mun, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/618,873

(22) Filed: Sep. 14, 2012

(65) Prior Publication Data

US 2013/0134554 A1    May 30, 2013

(30) Foreign Application Priority Data

Nov. 29, 2011  (KR) .................. 10-2011-0125763

(51) Int. Cl.
*H01L 21/02* (2006.01)

(52) U.S. Cl.
USPC .............. 257/532; 257/E21.008; 438/386

(58) Field of Classification Search
None
See application file for complete search history.

(56) References Cited

U.S. PATENT DOCUMENTS

| | | | | |
|---|---|---|---|---|
| 4,777,490 A | * | 10/1988 | Sharma et al. | 343/754 |
| 5,517,385 A | * | 5/1996 | Galvagni et al. | 361/312 |
| 6,344,961 B1 | * | 2/2002 | Naito et al. | 361/302 |
| 7,235,453 B2 | | 6/2007 | Kim | |
| 1,003,158 A1 | | 2/2011 | Kang et al. | |
| 2001/0052609 A1 | * | 12/2001 | Agarwal et al. | 257/295 |
| 2008/0253097 A1 | * | 10/2008 | Kawano | 361/766 |
| 2010/0301491 A1 | * | 12/2010 | Yang | 257/773 |
| 2011/0197409 A1 | | 8/2011 | Kim et al. | |

FOREIGN PATENT DOCUMENTS

KR     10-0668957     1/2007

\* cited by examiner

*Primary Examiner* — Michael Lebentritt
*Assistant Examiner* — Kevin Quinto
(74) *Attorney, Agent, or Firm* — Rabin & Berdo, P.C.

(57) ABSTRACT

Provided are vertical capacitors and methods of forming the same. The formation of the vertical capacitor may include forming input and output electrodes on a top surface of a substrate, etching a bottom surface of the substrate to form via electrodes, and then, forming a dielectric layer between the via electrodes. As a result, a vertical capacitor with high capacitance can be provided in a small region of the substrate.

10 Claims, 8 Drawing Sheets

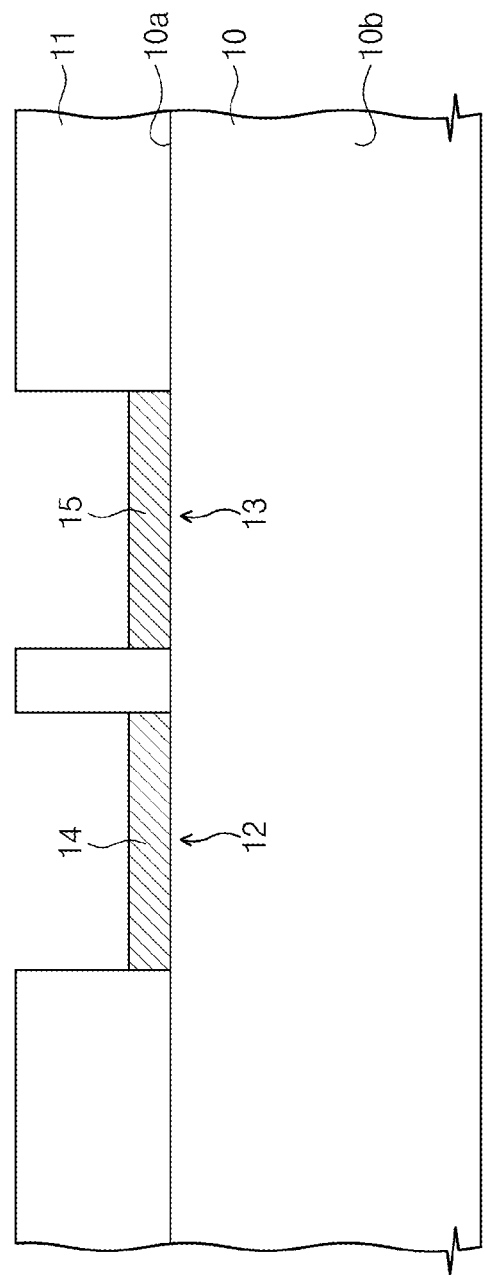

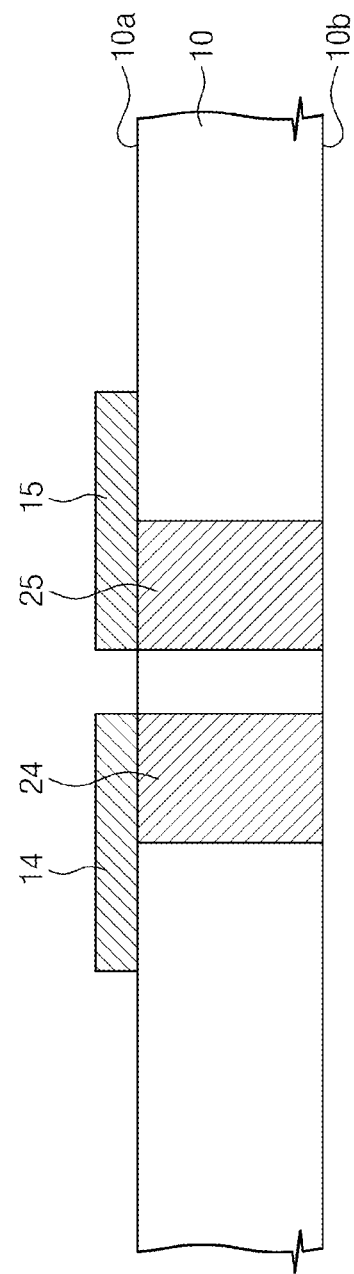

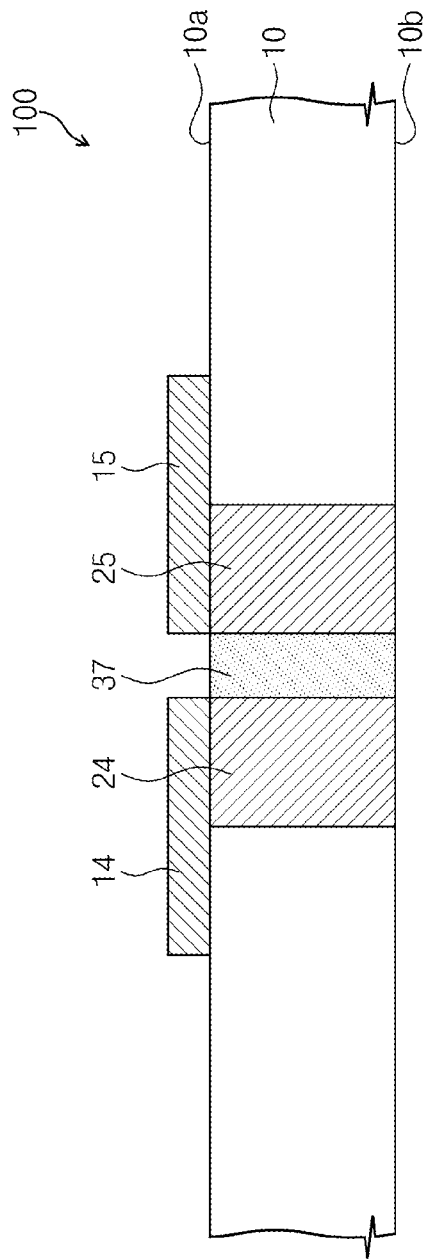

VERTICAL CAPACITORS AND METHODS OF FORMING THE SAME

CROSS-REFERENCE TO RELATED APPLICATIONS

This U.S. non-provisional patent application claims priority under 35 U.S.C. §119 to Korean Patent Application No. 10-2011-0125763, filed on Nov. 29, 2011, in the Korean Intellectual Property Office, the entire contents of which are hereby incorporated by reference.

BACKGROUND OF THE INVENTION

Embodiments of the inventive concepts relate to a vertical capacitor, and in particular, to methods of forming a vertical capacitor using a semiconductor process and vertical capacitors formed thereby.

A capacitor is a typical component constituting electronic devices (e.g., semiconductor integrated circuit). There is an increasing demand for capacitors with high capacitance.

A basic structure of the capacitor may be a metal-insulator-metal (MIM) structure including an upper electrode, a lower electrode, and a dielectric layer interposed therebetween. The capacitance of the capacitor is linearly proportional to a facing area between the upper and lower electrodes, and thus, in order to obtain high capacitance, the capacitor should be configured to increase the facing area between the upper and lower electrodes. However, there are many technical difficulties in increasing the facing area between the upper and lower electrodes, due to increasing integration density of the semiconductor devices and increasing demands for lightweight, thin, and small electronic devices.

SUMMARY

Embodiments of the inventive concepts provide vertical capacitors having high capacitance and a small occupying area, and methods of forming the same.

Other example embodiments of the inventive concept provide methods of forming a vertical capacitor using a semiconductor process and vertical capacitors formed thereby.

According to example embodiments of the inventive concepts, a method of forming a vertical capacitor may include forming an input electrode and an output electrode spaced apart from each other on a top surface of a substrate, etching a bottom surface of the substrate to form first via holes, the first via holes being spaced apart from each other to expose the input and output electrodes, forming a conductive material in the first via holes to form via electrodes connected to the input and output electrodes, and forming a dielectric layer in the substrate to be interposed between the via electrodes.

In example embodiments, the input and output electrodes may be formed by depositing one of Ti, Ta, W, TiN, WN, TaSiN, WSiN, or Au using a sputtering process.

In example embodiments, the via electrodes may be formed by depositing one of Ti, Ta, W, Ru, TiN, WN, TaSiN, or WSiN using a sputtering process.

In example embodiments, the forming of forming the dielectric layer may include etching the substrate to form a second via hole between the via electrodes, and then, filling the second via hole with a dielectric material.

In example embodiments, the dielectric layer may be formed by one of physical vapor deposition (PVD), chemical vapor deposition (CVD), and atomic layer deposition (ALD) processes.

In example embodiments, the dielectric layer may include at least one of silicon oxide, aluminum oxide, tantalum oxide, silicon oxynitride, or silicon nitride.

According to example embodiments of the inventive concepts, a vertical capacitor may include a substrate, input and output electrodes provided spaced apart from each other, on a top surface of the substrate, via electrodes extending from a bottom surface of the substrate to the top surface of the substrate to be electrically connected to the input and output electrodes, and a dielectric layer provided through the substrate between the via electrodes.

In example embodiments, the via electrodes may include one of Ti, Ta, W, TiN, WN, TaSiN, WSiN, or Au.

In example embodiments, the dielectric layer may be formed of a dielectric material having a dielectric constant greater than that of the substrate.

In example embodiments, the dielectric layer may include at least one of silicon oxide, aluminum oxide, tantalum oxide, silicon oxynitride, or silicon nitride.

BRIEF DESCRIPTION OF THE DRAWINGS

Example embodiments will be more clearly understood from the following brief description taken in conjunction with the accompanying drawings. FIGS. 1A through 1H represent non-limiting, example embodiments as described herein.

FIGS. 1A through 1H are sectional views illustrating a method of forming a vertical capacitor according to example embodiments of the inventive concept.

Figure 1B:
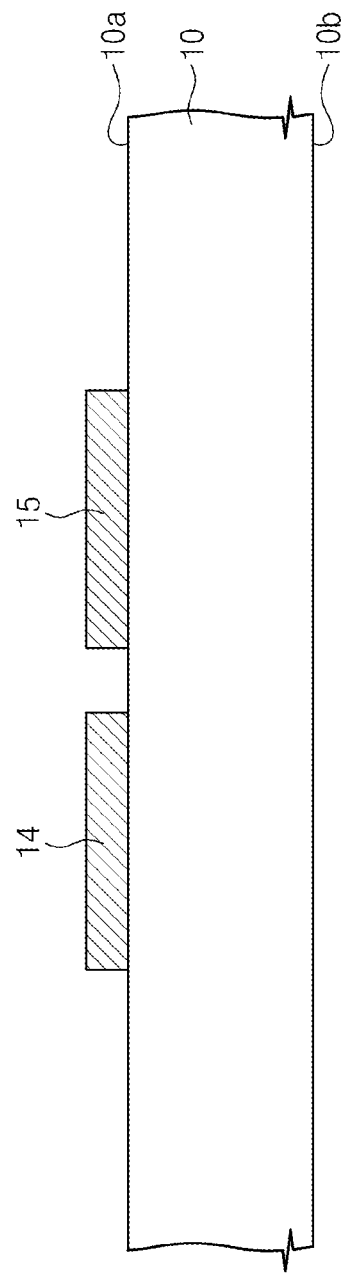

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 1H are sectional views illustrating a method of forming a vertical capacitor according to example embodiments of the inventive concept.

Referring to FIG. 1A, a photoresist layer may be formed on a top surface 10a of a substrate 10. The substrate 10 may be a semiconductor substrate. For example, the semiconductor substrate may include at least one of Si, GaAs, or GaN. The photoresist layer may be patterned to form a first photoresist pattern 11 exposing a first surface 12 and a second surface 13 of the top surface 10a. The first portion 12 and the second portion 13 may be spaced apart from each other. An input electrode 14 and an output electrode 15 may be formed on the first and second surfaces 12 and 13, respectively, of the top surface 10a exposed by the first photoresist pattern 11. The input electrode 14 and the output electrode 15 may be formed of at least one of Ti, Ta, W, TiN, WN, TaSiN, WSiN, or Au. In example embodiments, the input and output electrodes 14 and 15 may be formed by a sputtering process, but example embodiments of the inventive concept may not be limited thereto.

Referring to FIG. 1B, the first photoresist pattern 11 may be removed by, for example, an ashing process or a wet etching process using an organic stripper. As a result, the input and output electrodes 14 and 15 spaced apart from each other may remain on the top surface 10a of the substrate 10. Hereinafter, the process of forming the input and output electrodes 14 and 15 will be referred to as a "front-side process". In example embodiments, the input electrode 14 and the output electrode 15 may be connected to an active device (not shown) and/or a passive device (not shown).

After the front-side process, a bottom surface 10b of the substrate 10 may be polished to make the substrate 10 thin. The polishing of the substrate 10 may be performed using a chemical and/or mechanical polishing process (e.g., CMP).

Figure 1C:
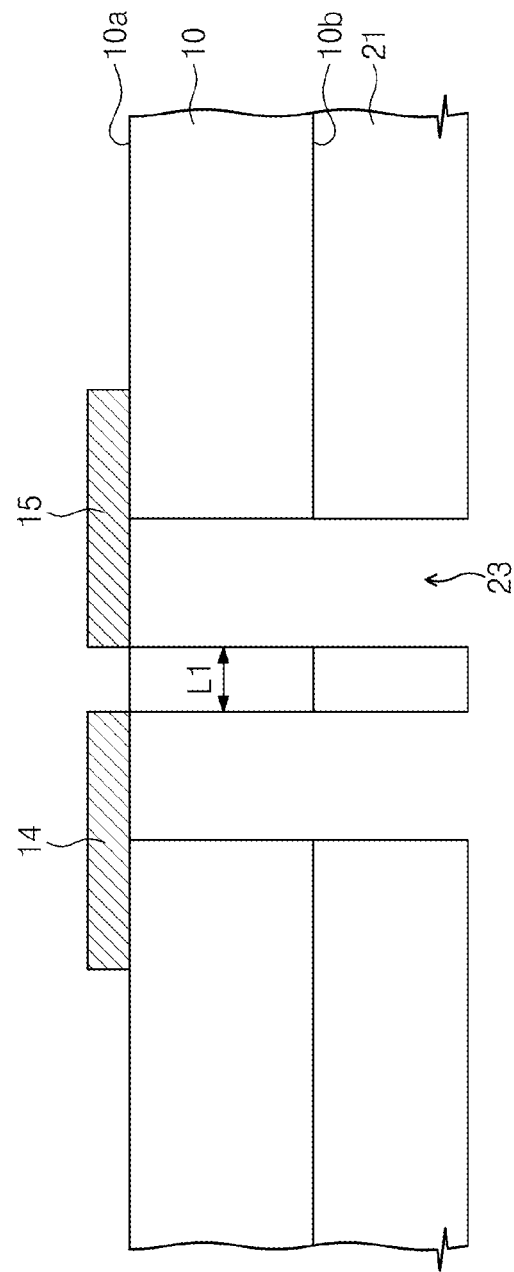

Referring to FIG. 1C, a second photoresist pattern 21 may be formed on the bottom surface 10b. The bottom surface 10b exposed by the second photoresist pattern 21 may be etched to form first via holes 23 spaced apart from each other. The first via holes 23 may extend to the top surface 10a of the substrate 10. The first via holes 23 may be formed to expose, for example, bottom surfaces of the input and output electrodes 14 and 15. In example embodiments, the first via holes 23 may be formed to have a space L1 that is substantially equivalent to that between the input and output electrodes 14 and 15. In other example embodiments, the space L1 between the first via holes 23 may be different from that of the embodiments depicted in the drawings; for example, the space L1 may be greater than the space between the input and output electrodes 14 and 15. In example embodiments, the space L1 between the first via holes 23 may be controlled through a patterning process of the first via holes 23.

Figure 1D:
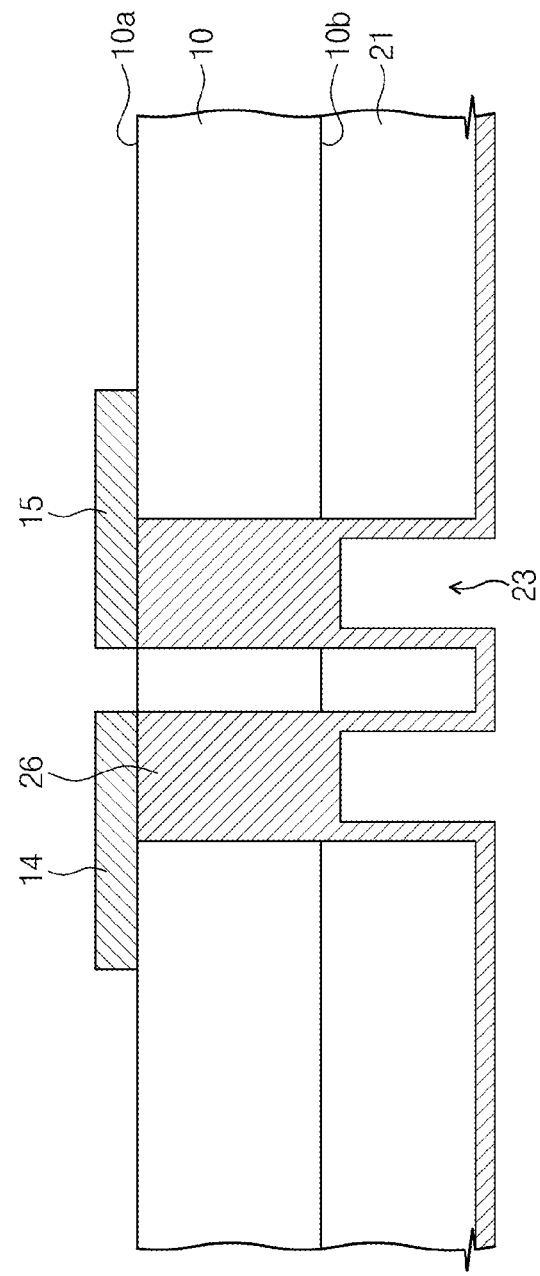

Referring to FIG. 1D, a conductive material 26 may be deposited to fill or cover the first via holes 23. In example embodiments, the second photoresist pattern 21 may be removed before the deposition of the conductive material 26. The conductive material 26 may cover not only inner surfaces of the first via hole 23 but also a bottom surface of the second photoresist pattern 21. The conductive material 26 may be formed of a layer including at least one of Ti, Ta, W, TiN, WN, TaSiN, or WSiN. The conductive material 26 may be deposited by a sputtering process.

Referring to FIG. 1E, the second photoresist pattern 21 may be removed by, for example, an ashing process or a wet etching process using an organic stripper. In example embodiments, the removal of the second photoresist pattern 21 may include removing a portion of the conductive material 26 covering the second photoresist pattern 21. Via electrodes may be formed in the substrate 10. The via electrodes may include an input via electrode 24 and an output via electrode 25. The input via electrode 24 may be in contact with the input electrode 14, and the output via electrode 25 may be in contact with the output electrode 15. In other words, the input and output via electrodes 24 and 25 may be electrically connected to the input and output electrodes 14 and 15, respectively.

Figure 1F:
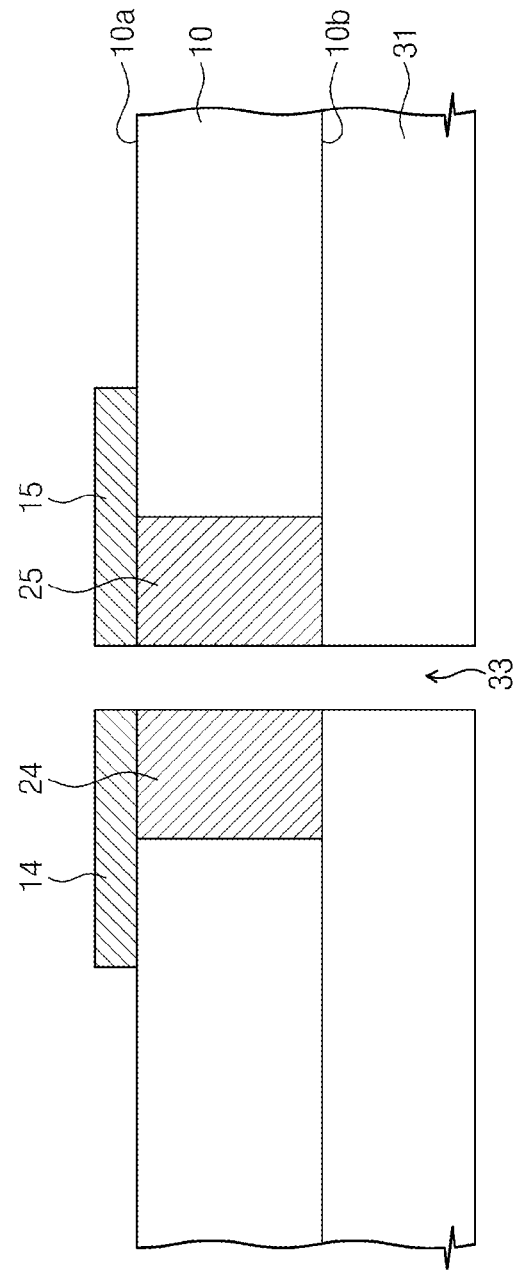

Referring to FIG. 1F, a third photoresist pattern 31 may be formed on the bottom surface 10b. The third photoresist pattern 31 may be formed to expose the substrate 10 between the input via electrode 24 and the output via electrode 25. The substrate 10 exposed by the third photoresist pattern 31 may be etched to form a second via hole 33. In example embodiments, the second via hole 33 may extend to the top surface 10a of the substrate 10 and be formed between the input via electrode 24 and the output via electrode 25.

Figure 1G:
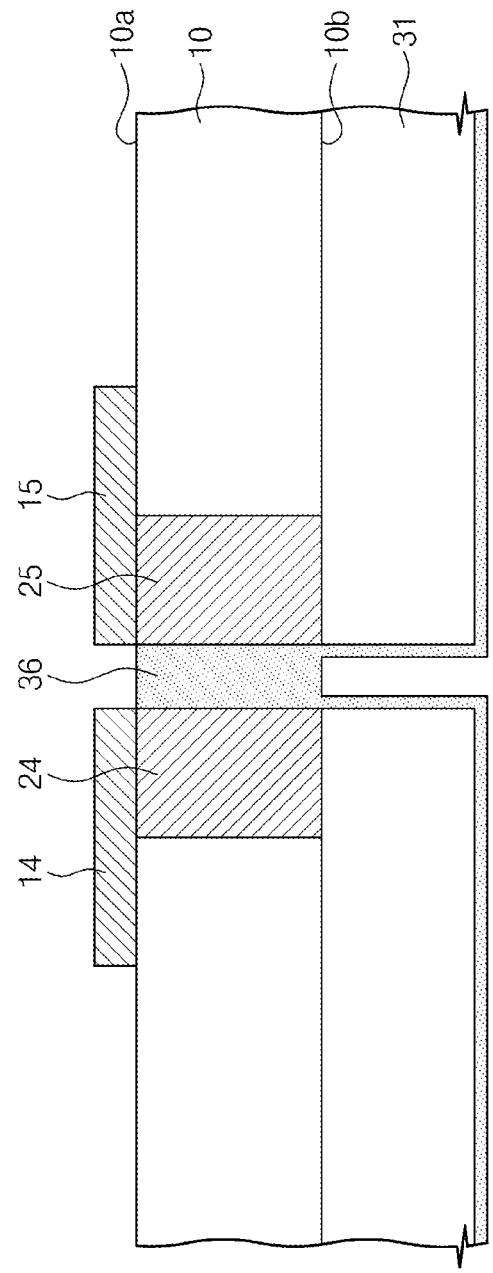

Referring to FIG. 1G, a dielectric material 36 may be deposited in the second via hole 33. The dielectric material 36 may be formed to fill or cover the second via hole 33. For example, the dielectric material 36 may include at least one of $SiO_2$, $Al_2O_3$, $Ta_2O_5$, SiON, or SiN. The dielectric material 36 may be formed using one of physical vapor deposition (PVD), chemical vapor deposition (CVD), or atomic layer deposition (ALD) processes.

Referring to FIG. 1H, the third photoresist pattern 31 may be removed by, for example, an ashing process or a wet etching process using an organic stripper. As a result of the removal of the third photoresist pattern 31, a portion of the dielectric material 36 covering the third photoresist pattern 31 may be removed. A dielectric layer 37 may be formed between the input via electrode 24 and the output via electrode 25. The dielectric layer 37 may be formed of a dielectric material having a dielectric constant greater than that of the substrate 10. As a result, a vertical capacitor 100 may be formed in the substrate 10.

According to example embodiments of the inventive concepts, it is possible to form a vertical capacitor having high capacitance in a small area.

According to example embodiments of the inventive concepts, a vertical capacitor is provided in or through a substrate, and thus, there is no necessity to perform an additional package.

While example embodiments of the inventive concepts have been particularly shown and described, it will be understood by those of ordinary skill in the art that variations in form and detail may be made therein without departing from the spirit and scope of the attached claims.

What is claimed is:

1. A method of forming a vertical capacitor, comprising:
    forming an input electrode and an output electrode spaced apart from each other on a top surface of a substrate;
    etching a bottom surface of the substrate to form first via holes, the first via holes being spaced apart from each other to expose the input and output electrodes;
    forming a conductive material in the first via holes to form via electrodes connected to the input and output electrodes; and
    forming a dielectric layer in the substrate to be interposed between the via electrodes.

2. The method of claim 1, wherein the input and output electrodes are formed by depositing one of Ti, Ta, W, TiN, WN, TaSiN, WSiN, or Au using a sputtering process.

3. The method of claim 1, wherein the via electrodes are formed by depositing one of Ti, Ta, W, Ru, TiN, WN, TaSiN, or WSiN using a sputtering process.

4. The method of claim 1, wherein the forming of the dielectric layer comprises:
    etching the substrate to form a second via hole between the via electrodes; and
    filling the second via hole with a dielectric material.

5. The method of claim 4, wherein the dielectric layer is formed by one of physical vapor deposition (PVD), chemical vapor deposition (CVD), and atomic layer deposition (ALD) processes.

6. The method of claim 5, wherein the dielectric layer comprises at least one of silicon oxide, aluminum oxide, tantalum oxide, silicon oxynitride, or silicon nitride.

7. A vertical capacitor, comprising:
    a substrate;
    input and output electrodes provided spaced apart from each other, on a top surface of the substrate;
    via electrodes extending from a bottom surface of the substrate to the top surface of the substrate to be electrically connected to the input and output electrodes; and
    a dielectric layer provided through the substrate between the via electrodes,
    wherein the via electrodes are spaced apart from each other to define a gap, and the via electrodes are not electrically connected with any material disposed within the gap,
    wherein each of the via electrodes has a shape of column extending in a vertical direction from the bottom surface to the top surface of the substrate, and each of the column-shaped via electrode is not electrically connected to any inner electrode disposed inside of the substrate between the top and bottom surfaces, and the dielectric layer is not formed as a plurality of laminated layers.

8. The vertical capacitor of claim 7, wherein the via electrodes comprise one of Ti, Ta, W, TiN, WN, TaSiN, WSiN, or Au.

9. The vertical capacitor of claim 7, wherein the dielectric layer is formed of a dielectric material having a dielectric constant greater than that of the substrate.

10. The vertical capacitor of claim 9, wherein the dielectric layer comprises at least one of silicon oxide, aluminum oxide, tantalum oxide, silicon oxynitride, or silicon nitride.

* * * * *